(12) United States Patent
Nakano et al.

(10) Patent No.: US 10,838,498 B2
(45) Date of Patent: Nov. 17, 2020

(54) TACTILE VIBRATION APPLYING DEVICE

(71) Applicant: Sumitomo Riko Company Limited, Aichi (JP)

(72) Inventors: Katsuhiko Nakano, Aichi (JP); Takanori Murase, Aichi (JP); Masaki Nasu, Aichi (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 616 days.

(21) Appl. No.: 15/627,877

(22) Filed: Jun. 20, 2017

(65) Prior Publication Data

US 2017/0285751 A1 Oct. 5, 2017

Related U.S. Application Data

(63) Continuation of application No. PCT/JP2016/079027, filed on Sep. 30, 2016.

(30) Foreign Application Priority Data

Dec. 25, 2015 (JP) .................................. 2015-253590

(51) Int. Cl.
*H01L 41/053* (2006.01)
*G06F 3/00* (2006.01)
(Continued)

(52) U.S. Cl.
CPC ............. *G06F 3/016* (2013.01); *B06B 1/0292* (2013.01); *B06B 1/0644* (2013.01); *G06F 3/041* (2013.01);
(Continued)

(58) Field of Classification Search
CPC ..... G06F 3/016; G06F 3/041; H01L 41/0536; H01L 41/0986
(Continued)

(56) References Cited

U.S. PATENT DOCUMENTS 9,288,583 B2 3/2016 Nakano et al.
2007/0096594 A1* 5/2007 Maruyama ............. G06F 3/011
310/317
(Continued)

FOREIGN PATENT DOCUMENTS

JP 5281322 9/2013
JP 2014-506691 3/2014
(Continued)

OTHER PUBLICATIONS

International Search Report, along with English-language translation thereof, issued in PCT/JP2016/079027, dated Dec. 13, 2016.

*Primary Examiner* — Derek J Rosenau
(74) *Attorney, Agent, or Firm* — Greenblum & Bernstein, P.L.C.

(57) ABSTRACT

To provide a tactile vibration applying device that efficiently outputs vibrations using an electrostatic or piezoelectric actuator. The tactile vibration applying device includes the electrostatic or piezoelectric actuator formed in a flat shape, and expanding and contracting in a thickness direction, a first elastic body having an elastic modulus smaller than an elastic modulus of the actuator in the thickness direction and disposed to contact a surface of the actuator on a side of the first electrode, and a first cover covering a surface of the first elastic body opposite to a surface of the first elastic body contacting the actuator, pressing the actuator and the first elastic body in the thickness direction of the actuator, and holding the first elastic body in a state that the first elastic body is compressed more than the actuator.

11 Claims, 3 Drawing Sheets

(51) Int. Cl.
  *G06F 3/01* (2006.01)
  *B06B 1/02* (2006.01)
  *G06F 3/041* (2006.01)
  *B06B 1/06* (2006.01)
  *H01L 41/09* (2006.01)
  *H01L 41/23* (2013.01)
  *H01L 41/25* (2013.01)
  *H04R 7/06* (2006.01)

(52) U.S. Cl.
  CPC ...... *H01L 41/0536* (2013.01); *H01L 41/0986* (2013.01); *H01L 41/23* (2013.01); *H01L 41/25* (2013.01); *H04R 7/06* (2013.01)

(58) Field of Classification Search
  USPC .................................................. 310/328, 338
  See application file for complete search history.

(56) References Cited

U.S. PATENT DOCUMENTS

| | | | |
|---|---|---|---|
| 2012/0206248 A1* | 8/2012 | Biggs | G06F 3/016 340/407.2 |
| 2014/0319971 A1 | 10/2014 | Yoo et al. | |
| 2014/0321675 A1 | 10/2014 | Nakano et al. | |
| 2017/0228022 A1* | 8/2017 | Shimanouchi | G06F 3/041 |

FOREIGN PATENT DOCUMENTS

| | | |
|---|---|---|
| WO | 2012/099854 | 7/2012 |
| WO | 2013/145411 | 10/2013 |

\* cited by examiner

TACTILE VIBRATION APPLYING DEVICE

CROSS REFERENCE TO RELATED APPLICATIONS

The present application is a Continuation Application of International Application No. PCT/JP2016/079027, filed on Sep. 30, 2016, which is incorporated herein by reference. The present invention is based on Japanese Patent Application No. 2015-253590, filed on Dec. 25, 2015, claiming the domestic priority of the former, the entire contents of which are incorporated herein by reference.

TECHNICAL FIELD

The present invention relates to a tactile vibration applying device.

BACKGROUND ART

One of various information transmission items is an item using a system of applying vibrations to human beings. In recent years, it is required to apply various senses to human beings by applying vibrations to the human beings while changing, for example, the frequency and amplitude complicatedly. Users thus select vibration actuators according to purposes. When selecting the vibration actuator, the users typically consider the power consumption. The vibration actuator includes a tactile vibration applying actuator and a voice vibration applying actuator. The tactile vibration is a low-frequency vibration, whereas the voice vibration is a high-frequency vibration.

An eccentric motor that rotates an eccentric mass member, a device that vibrates a vibrating member by a voice coil motor (also referred to as "linear resonant actuator"), an electrostatic actuator, and a piezoelectric actuator have been known as an actuator that generates a vibration.

The eccentric motor is typically driven by direct current (DC) and thus the eccentric motor operates only in a single direction. Consequently, the eccentric motor only transmits changes in magnitude of vibrations and in timing of vibrations, and thus the eccentric motor is unsuitable for applying complicated vibrations. Additionally, the eccentric motor has relatively large power consumption.

The voice coil motor is driven by a magnet, a coil, and a mass spring system, and thus the voice coil motor can apply complicated vibrations by receiving various input signals. The voice coil motor constitutes an LCR circuit and thus has an electrical resonance frequency. Consequently, the voice coil motor has small power consumption and large amplitude at the resonance frequency, whereas the voice coil motor has large power consumption and small amplitude when its frequency deviates from the resonance frequency. The voice coil motor is thus unsuitable for use in a wide frequency band and if the voice coil motor is used in such a wide frequency band, it requires a control algorithm for changing input signals. Meanwhile, the power consumption is large in a band that deviates from the resonance frequency.

The electrostatic actuator and the piezoelectric actuator constitute an RC circuit and thus the electrostatic and piezoelectric actuators do not have an electrical resonance frequency unlike the voice coil motor. Consequently, the electrostatic actuator and the piezoelectric actuator have small power consumption in a wide frequency band. The electrostatic actuator is disclosed in Japanese Patent No. 5281322 and Japanese Translation of PCT International Application Publication No. JP2014-506691A. WO 2013/145411 discloses a speaker using the electrostatic actuator.

SUMMARY

Technical Problems

If an electrostatic actuator or a piezoelectric actuator is used by itself, the amplitude of a vibration is small. These actuators thus have output vibrations insufficient for use as a tactile vibration applying actuator.

An object of the present invention is to provide a tactile vibration applying device that efficiently outputs vibrations using an electrostatic or piezoelectric actuator.

Solutions to Problems

A tactile vibration applying device according to the present invention includes an electrostatic or piezoelectric actuator formed in a flat shape, having a first electrode and a second electrode opposing to each other in a thickness direction, and expanding and contracting at least in the thickness direction; a first elastic body having an elastic modulus smaller than an elastic modulus of the electrostatic or piezoelectric actuator in the thickness direction and disposed in contact with a surface of the electrostatic or piezoelectric actuator on a side of the first electrode; and a first cover covering a surface of the first elastic body opposite to a surface of the first elastic body contacting the electrostatic or piezoelectric actuator, pressing the electrostatic or piezoelectric actuator and the first elastic body in the thickness direction of the electrostatic or piezoelectric actuator, and holding the first elastic body in a state that the first elastic body is compressed more than the electrostatic or piezoelectric actuator.

The elastic modulus of the first elastic body is smaller than the elastic modulus of the actuator in the thickness direction. In a state where the first elastic body is pressed against the first cover, the first elastic body is compressed more than the actuator. The first cover keeps such a state as an initial state. In a state where the first cover presses the actuator and the first elastic body, the compression amount of the actuator is small. The expansion and contraction of the actuator is thus hardly affected even if the first cover presses the actuator.

When a voltage is applied to the first electrode and the second electrode of the actuator, the actuator expands and contracts in the thickness direction. The displacement of the surface of the actuator on the side of the first electrode according to the expansion and contraction of the actuator is transmitted via the first elastic body to the first cover. Additionally, the elastic deformation force of the first elastic body is changed by the expansion and contraction of the actuator and such a change in the elastic deformation force of the first elastic body is transmitted to the first cover. The first elastic body is compressed in the initial state and thus vibrations can be efficiently applied to the first cover. That is, even if vibrations of the actuator alone are small, tactile vibrations can be applied to the first cover.

DESCRIPTION OF EMBODIMENTS

1. First Embodiment (1-1) Structure of Tactile Vibration Applying Device 1

The structure of a tactile vibration applying device 1 is described with reference to FIG. 1. The tactile vibration applying device 1 applies tactile vibrations to human beings. The tactile vibration, in contrast to a voice vibration, is detected by human beings through a tactile sense, and is a low-frequency vibration as compared to the voice vibration.

Figure 1:
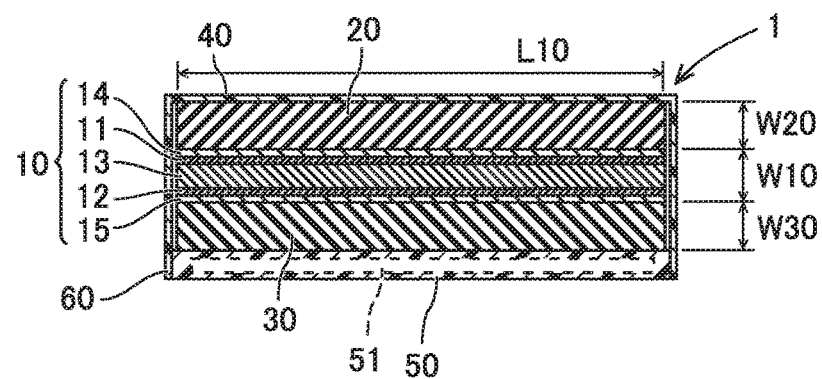
FIG. 1 is a cross-sectional view of a tactile vibration applying device according to a first embodiment.

As shown in FIG. 1, the tactile vibration applying device 1 includes an actuator 10, a first elastic body 20, a second elastic body 30, a first cover 40, a second cover 50, and a peripheral cover 60.

The actuator 10 is an electrostatic actuator or a piezoelectric actuator. According to a first embodiment, the actuator 10 is an electrostatic actuator. The actuator 10 is flat. While the outline of the actuator 10 is, for example, rectangular, the outline may be formed in any shape. The actuator 10 expands and contracts at least in a thickness direction. When the actuator 10 is an electrostatic actuator, the actuator 10 expands and contracts also in a flat surface direction. That is, when the actuator 10 is an electrostatic actuator, the actuator 10 is molded with an elastomer.

Specifically, the actuator 10 includes, as shown in FIG. 1, a first electrode 11, a second electrode 12, a dielectric layer 13, a first insulating layer 14, and a second insulating layer 15. These electrodes and layers are flat. The elastic modulus (Young's modulus) of the entire actuator 10 in the thickness direction is denoted by $E1_{(10)}$. The elastic modulus of the entire actuator 10 in the flat surface direction is denoted by $E2_{(10)}$. The loss coefficient tan δ of the entire actuator 10 is denoted by $\tan \delta_{(10)}$.

The first electrode 11 and the second electrode 12 are disposed to oppose to each other with a distance therebetween in the thickness direction of the actuator 10. The dielectric layer 13 is interposed between the first electrode 11 and the second electrode 12. The first insulating layer 14 is disposed to contact a surface of the first electrode 11 opposite to a surface thereof opposing the dielectric layer 13, and covers the first electrode 11. The second insulating layer 15 is disposed to contact a surface of the second electrode 12 opposite to a surface thereof opposing the dielectric layer 13, and covers the second electrode 12.

The first electrode 11 and the second electrode 12 are formed in the same shape, and molded by mixing a conductive filler with an elastomer. The first electrode 11 and the second electrode 12 are thus flexible and stretchable. Examples of the elastomer forming the first electrode 11 and the second electrode 12 include silicone rubber, ethylene-propylene copolymer rubber, natural rubber, styrene-butadiene copolymer rubber, acrylonitrile-butadiene copolymer rubber, acrylic rubber, epichlorohydrin rubber, chlorosulfonated polyethylene, chlorinated polyethylene, and urethane rubber. It is only required that the conductive filler mixed with the first electrode 11 and the second electrode 12 is conductive particles, and for example, particles of a carbon material or a metal can be used for the conductive filler.

The dielectric layer 13, the first insulating layer 14, and the second insulating layer 15 are molded with an elastomer. The dielectric layer 13, the first insulating layer 14, and the second insulating layer 15 are thus flexible and stretchable. A material that functions as a dielectric body in the electrostatic actuator 10 is used for the dielectric layer 13. The dielectric layer 13 is particularly formed to be the thickest among the components constituting the actuator 10, and the dielectric layer 13 can expand and contract in the thickness direction and the flat surface direction. An insulating material is used for the first insulating layer 14 and the second insulating layer 15.

Examples of the elastomer forming the dielectric layer 13, the first insulating layer 14, and the second insulating layer 15 include silicone rubber, acrylonitrile-butadiene copolymer rubber, acrylic rubber, epichlorohydrin rubber, chlorosulfonated polyethylene, chlorinated polyethylene, and urethane rubber.

The first elastic body 20 and the second elastic body 30 are made of the same material and formed in the same flat shape. The peripheral edge shape of the first elastic body 20 and the second elastic body 30 is the same as that of the actuator 10. The first elastic body 20 is disposed to contact a surface of the actuator 10 on a side of the first electrode 11 (a top surface of the actuator 10 in FIG. 1), that is, the entire surface of the first insulating layer 14. The second elastic body 30 is disposed to contact a surface of the actuator 10 on a side of the second electrode 12 (a bottom surface of the actuator 10 in FIG. 1), that is, the entire surface of the second insulating layer 15.

A material with a small elastic modulus $E_{(20)}$ and a small loss coefficient $\tan \delta_{(20)}$ is used for the first elastic body 20, and a material with a small elastic modulus $E_{(30)}$ and a small loss coefficient $\tan \delta_{(30)}$ is used for the second elastic body 30. That is to say, a material that is soft and has low attenuation characteristics is suitable for the first elastic body 20 and the second elastic body 30. In particular, the elastic moduli $E_{(20)}$ and $E_{(30)}$ of the first elastic body 20 and the second elastic body 30 are smaller than the elastic modulus $E1_{(10)}$ of the actuator 10 in the thickness direction.

The ratio of the elastic modulus $E_{(20)}$ of the first elastic body 20 to the elastic modulus $E1_{(10)}$ of the actuator 10 in the thickness direction is particularly equal to or less than 15%. The ratio of the elastic modulus $E_{(30)}$ of the second elastic body 30 to the elastic modulus $E1_{(10)}$ of the actuator 10 in the thickness direction is also equal to or less than 15%. These ratios are preferably equal to or less than 10%.

Additionally, the first elastic body 20 and the second elastic body 30 respectively have the loss coefficients $\tan \delta_{(20)}$ and $\tan \delta_{(30)}$ that are equal to or less than the loss coefficient $\tan \delta_{(10)}$ of the actuator 10 under predetermined conditions. The predetermined conditions include a usage environment in which the temperature is in the range of −10° C. to 50° C. and the vibration frequency is equal to or less than 300 Hz.

For example, silicone rubber that meets the conditions described above is suitable for the first elastic body 20 and the second elastic body 30. For example, urethane rubber is not suitable for the first elastic body 20 and the second elastic body 30 because the urethane rubber has relatively good attenuation characteristics. However, urethane rubber may be used for the first elastic body 20 and the second elastic body 30 depending on target characteristics.

The first cover 40 is flat and covers a surface of the first elastic body 20 (a top surface of the first elastic body 20 in FIG. 1). This surface of the first elastic body 20 is opposite to a surface of the first elastic body 20 contacting the actuator 10. The second cover 50 is flat and covers a surface of the second elastic body 30 (a bottom surface of the second elastic body 30 in FIG. 1). This surface of the second elastic body 30 is opposite to a surface of the second elastic body 30 contacting the actuator 10.

The peripheral cover 60 is formed in a cylindrical shape to cover the peripheral surfaces of the actuator 10, the first elastic body 20, and the second elastic body 30. The peripheral cover 60 is provided at the outer peripheral edge of the first cover 40 and formed integrally with the first cover 40, constituting an integral member. That is, the integral member of the first cover 40 and the peripheral cover 60 is formed in a capsule shape to cover the surface of the first elastic body 20 and the peripheral surfaces of the actuator 10, the first elastic body 20, and the second elastic body 30. The peripheral cover 60 is fixed to the second cover 50, which is separated from the integral member. The peripheral cover 60 is slightly spaced apart from the outer peripheral surfaces of the actuator 10, the first elastic body 20, and the second elastic body 30. That is, the peripheral cover 60 allows for stretching of the actuator 10, the first elastic body 20, and the second elastic body 30 in the flat surface direction.

The entire surfaces of the actuator 10, the first elastic body 20, and the second elastic body 30 are covered by the first cover 40, the second cover 50, and the peripheral cover 60. The first cover 40 and the second cover 50 press the actuator 10, the first elastic body 20, and the second elastic body 30 in the thickness direction of the actuator 10. The first cover 40 and the second cover 50 are fixed in this state through the peripheral cover 60.

The first cover 40 and the second cover 50 respectively have elastic moduli $E_{(40)}$ and $E_{(50)}$ larger than the elastic modulus $E1_{(10)}$ of the actuator 10 in the thickness direction, the elastic modulus $E_{(20)}$ of the first elastic body 20, and the elastic modulus $E_{(30)}$ of the second elastic body 30. Various materials that meet the conditions described above such as a resin, a metal, and an elastomer can be used for the first cover 40 and the second cover 50.

The relationship of the elastic moduli of the members constituting the tactile vibration applying device 1 is represented by the following formula (1). The first cover 40 and the second cover 50 hold the actuator 10, the first elastic body 20, and the second elastic body 30 in a compressed state. Here, the elastic modulus $E_{(20)}$ of the first elastic body 20 and the elastic modulus $E_{(30)}$ of the second elastic body 30 are smaller than the elastic modulus $E1_{(10)}$ of the actuator 10 in the thickness direction. The first elastic body 20 and the second elastic body 30 are thus compressed more than the actuator 10.

[Formula 1]

$$E_{(40)}, E_{(50)} > E1_{(10)} > E_{(20)} = E_{(30)} \ldots \quad (1)$$

Additionally, the second cover 50 is electrically connected to the first electrode 11 and the second electrode 12, and functions as a circuit board unit including a drive circuit 51 for controlling a voltage applied to the first electrode 11 and the second electrode 12. Meanwhile, the first cover 40 is a tactile vibration applying part for a user. That is, the user receives tactile vibrations by contacting the first cover 40.

(1-2) Description of Deformation of Internal Components

Next, the internal components 10, 20, and 30 of the tactile vibration applying device 1 before and after being held by the first cover 40 and the second cover 50 are described with reference to FIGS. 1 and 2. The internal components 10, 20, and 30 are held by the first cover 40 and the second cover 50 as shown in FIG. 1. The thickness of the actuator 10 is denoted by W10 and the width of the actuator 10 in the flat direction is denoted by L10. The thickness of the first elastic body 20 is denoted by W20 and the thickness of the second elastic body 30 is denoted by W30.

Figure 2:
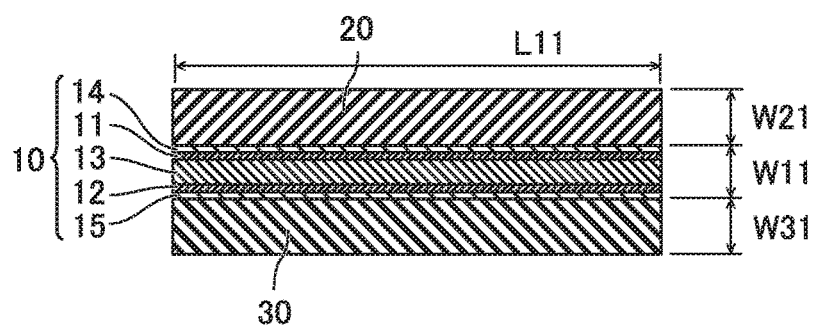
FIG. 2 is a cross-sectional view of internal components of the tactile vibration applying device shown in FIG. 1 before the tactile vibration applying device is mounted on a cover.

Meanwhile, FIG. 2 shows the internal components 10, 20, and 30 before being held by the first cover 40 and the second cover 50. The thickness of the actuator 10 seems to be equal to W10, but in practice, the thickness is denoted by W11 that is slightly larger than W10. On the other hand, the width of the actuator 10 in the flat direction seems to be equal to L10, but in practice, the width in the flat direction is denoted by L11 that is slightly smaller than L10. The thickness of the first elastic body 20 is denoted by W21 that is much larger than W20, and the thickness of the second elastic body 30 is denoted by W31 that is much larger than W30. The internal components 10, 20, and 30 before and after compression thus satisfy the following formulae (2) and (3).

[Formula 2]

$$\frac{W11 - W10}{W11} < \frac{W21 - W20}{W21} = \frac{W31 - W30}{W31} \quad (2)$$

[Formula 3]

$$\begin{cases} W11 - W10 < W21 - W20 \\ W11 - W10 < W31 - W30 \end{cases} \quad (3)$$

Formula (2) is a relational expression of compressibility, whereas formula (3) is a relational expression of compression amount. The compressibility of the first elastic body 20 and the second elastic body 30 is larger than that of the actuator 10 in the thickness direction. The compression amount of the first elastic body 20 and the second elastic body 30 is also larger than that of the actuator 10.

(1-3) Operations of Actuator and Tactile Vibration Applying Device

Figure 3:
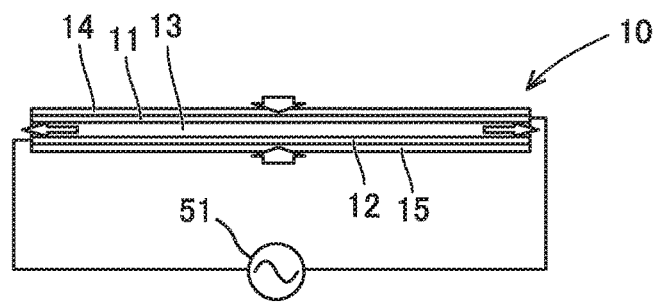
FIG. 3 shows electrical connection of an electrostatic actuator and a drive circuit constituting the tactile vibration applying device shown in FIG. 1, and deformation of the electrostatic actuator when a voltage is applied to the electrostatic actuator.

Next, operations of the actuator 10 and the tactile vibration applying device 1 are described with reference to FIGS. 1 and 3. As shown in FIG. 3, the first electrode 11 and the second electrode 12 of the actuator 10 are connected to the drive circuit 51. The drive circuit 51 may apply an alternating voltage (a periodic voltage including positive and negative values) to the first and second electrodes, or may apply a periodic voltage including positive offset values to the second electrode 12 while the first electrode 11 is connected to the ground potential. In particular, the first electrode 11 disposed on a side that a human being approaches is connected to the ground potential and this further improves the safety.

When the amount of charge accumulated in the first electrode 11 and the second electrode 12 increases, the dielectric layer 13 is compressed and deformed. That is, the thickness of the actuator 10 reduces and the width of the actuator 10 in the flat direction increases as shown in FIG. 3. On the other hand, when the amount of charge accumulated in the first electrode 11 and the second electrode reduces, the dielectric layer 13 returns to its original shape. That is, the thickness of the actuator 10 increases and the width of the actuator 10 in the flat direction reduces. The actuator 10 expands and contracts in the flat surface direction as well as in the thickness direction.

When the actuator 10 expands and contracts, the tactile vibration applying device 1 operates as follows. A state where the first elastic body 20 and the second elastic body 30 are compressed in the thickness direction as shown in FIG. 1 is referred to as an initial state of the tactile vibration applying device 1. When the thickness of the actuator 10 is reduced by an increase in the amount of charge, the first elastic body 20 and the second elastic body 30 are deformed so as to have a smaller compression amount than in the initial state. On the other hand, when the thickness of the actuator 10 is increased by a reduction in the amount of charge, the first elastic body 20 and the second elastic body 30 operate to return to the initial state. That is, the first elastic body 20 and the second elastic body 30 are deformed so as to have a larger compression amount than in a case where the amount of charge increases.

As the drive circuit 51 applies a periodic voltage to the first electrode 11 and the second electrode 12, the actuator 10 interposed between the first elastic body 20 and the second elastic body 30 changes its shape as follows: flat shape-→curved shape projecting upward in FIG. 1→flat shape-→curved shape projecting downward in FIG. 1→flat shape.

The displacement of a surface of the actuator 10 on a side of the first insulating layer 14 according to the deformation of the actuator 10 is transmitted via the first elastic body 20 to the first cover 40. Additionally, the elastic deformation force of the first elastic body 20 is changed by the expansion and contraction of the actuator 10 and such a change in the elastic deformation force of the first elastic body 20 is transmitted to the first cover 40. The first elastic body 20 and the second elastic body 30 are compressed in the initial state and thus vibrations can be efficiently applied to the first cover 40. That is, even if vibrations of the actuator 10 alone are small, tactile vibrations can be applied to the first cover 40.

If the loss coefficient tan $\delta_{(20)}$ of the first elastic body 20 and the loss coefficient tan $\delta_{(30)}$ of the second elastic body 30 are very large, vibrations are absorbed by the first elastic body 20 and the second elastic body 30 even though the actuator 10 expands and contracts. In such a case, vibrations of the actuator 10 are hardly transmitted to the first cover 40 even though the actuator 10 expands and contracts.

According to the present embodiment, however, materials with small loss coefficients tan $\delta_{(20)}$ and tan $\delta_{(30)}$ are used for the first elastic body 20 and the second elastic body 30. In particular, the loss coefficient tan $\delta_{(10)}$ of the actuator 10, the loss coefficient tan $\delta_{(20)}$ of the first elastic body 20, and the loss coefficient tan $\delta_{(30)}$ of the second elastic body 30 satisfy the following formula (4). Vibrations caused by the expansion and contraction of the actuator 10 are transmitted to the first cover 40 without being absorbed by the first elastic body 20 and the second elastic body 30.

[Formula 4]

$$\tan \delta_{(10)} \geq \tan \delta_{(20)} = \tan \delta_{(30)} \ldots \quad (4)$$

As indicated by formula (1), the elastic modulus $E_{(20)}$ of the first elastic body 20 and the elastic modulus $E_{(30)}$ of the second elastic body 30 are smaller than the elastic modulus $E1_{(10)}$ of the actuator 10 in the thickness direction. The actuator 10 is thus hardly compressed in the initial state where no voltage is applied to the first electrode 11 and the second electrode 12. Consequently, if the first cover 40 and the second cover 50 press the actuator 10, this does not affect the expansion and contraction of the actuator 10. Therefore, the actuator 10 can expand and contract reliably.

(1-4) Effects of First Embodiment

As described above, the tactile vibration applying device 1 according to the first embodiment can reliably generate tactile vibrations by efficiently transmitting small vibrations of the actuator 10 to the first cover 40. The first cover 40 and the second cover 50 press the actuator 10, the first elastic body 20, and the second elastic body 30 with the actuator 10 interposed between the first elastic body 20 and the second elastic body 30. The actuator 10 thus expands and contracts in the initial state without any external influence. It is possible to efficiently obtain tactile vibrations in the first cover 40. The second cover 50 is a circuit board unit including the drive circuit 51. As the second cover 50 also functions as a circuit board unit, it is possible to achieve compactness and an efficient arrangement.

The ratio of the elastic modulus $E_{(20)}$ of the first elastic body 20 to the elastic modulus $E1_{(10)}$ of the actuator 10 in the thickness direction is equal to or less than 15%. The ratio of the elastic modulus $E_{(30)}$ of the second elastic body 30 to the elastic modulus $E1_{(10)}$ of the actuator 10 in the thickness direction is also equal to or less than 15%. The first elastic body 20 and the second elastic body 30 can thus be compressed more than the actuator 10 in the initial state.

Materials with small loss coefficients tan $\delta_{(20)}$ and tan $\delta_{(30)}$ are used for the first elastic body 20 and the second elastic body 30. The first elastic body 20 and the second elastic body 30 can thus transmit vibrations caused by the expansion and contraction of the actuator 10 to the first cover 40 without absorbing the vibrations. This is reliably achieved when silicone rubber is used for the first elastic body 20 and the second elastic body 30. The loss coefficient tan $\delta_{(20)}$ of the first elastic body 20 and the loss coefficient tan $\delta_{(30)}$ of the second elastic body 30 are equal to or less than the loss coefficient tan $\delta_{(10)}$ of the actuator 10 in the usage environment in which the temperature is in the range of −10° C. to 50° C. and the vibration frequency is equal to or less than 300 Hz. The first elastic body 20 and the second elastic body 30 can thus reliably transmit vibrations caused by the expansion and contraction of the actuator 10 to the first cover 40 without absorbing the vibrations.

The first elastic body 20 and the second elastic body 30 are formed to be flat with an elastomer. The deformation of the actuator 10 according to the expansion and contraction of the actuator 10 can be reliably transmitted to the first cover 40. Even if the actuator 10 is an electrostatic actuator or a piezoelectric actuator, vibrations in the first cover 40 have a low frequency. The structure described above enables the tactile vibration applying device 1 to easily generate tactile vibrations in a frequency band lower than that of voice vibrations.

Additionally, as the actuator 10 is an electrostatic actuator formed of an elastomer, the tactile vibration applying device 1 generates low-frequency tactile vibrations more reliably.

2. Modification of First Embodiment

An electrostatic actuator is used for the actuator 10 in the first embodiment. A piezoelectric actuator may be used for the actuator 10. In this case, the dielectric layer 13 is replaced by a piezoelectric body. That is, the piezoelectric body is interposed between the first electrode 11 and the second electrode 12. The actuator 10 operates in the same manner as in the first embodiment to generate tactile vibrations in the first cover 40.

The first cover 40 according to the first embodiment may be a touch panel member. In this case, the drive circuit 51 applies a periodic voltage to the actuator 10 according to an operation of the touch panel member by a user, for example. According to the operation of the touch panel member by the user, tactile vibrations are applied to the user contacting the touch panel member.

3. Second Embodiment

A tactile vibration applying device 100 according to a second embodiment is described with reference to FIGS. 4 and 5. In the tactile vibration applying device 100 according to the second embodiment, the same structures as in the tactile vibration applying device 1 according to the first embodiment are denoted by the same reference numerals, and descriptions thereof are omitted.

The tactile vibration applying device 100 includes an actuator 10, a first elastic body 20, a second elastic body 30, a peripheral elastic body 170, a first cover 140, a second cover 150, and a peripheral cover 160. The tactile vibration applying device 100 according to the second embodiment is different from the tactile vibration applying device 1 according to the first embodiment in the shape of the first cover 140, the second cover 150, and the peripheral cover 160. Further, the peripheral elastic body 170 is additionally provided.

The peripheral elastic body 170 is made of the same material as the first elastic body 20 in a cylindrical shape. The peripheral elastic body 170 is disposed on an outer peripheral surface of the first elastic body 20 to be integral with the first elastic body 20. An inner peripheral surface of the peripheral elastic body 170 conforms an outer peripheral surface of the actuator 10. The peripheral elastic body 170 is disposed to contact the entire peripheral surface of the actuator 10.

A material with a small elastic modulus $E_{(170)}$ and a small loss coefficient $\tan \delta_{(170)}$ is used for the peripheral elastic body 170 as well as the first elastic body 20. That is to say, a material that is soft and has low attenuation characteristics is suitable for the peripheral elastic body 170. In particular, the peripheral elastic body 170 satisfies formula (5). That is, the peripheral elastic body 170 has the elastic modulus $E_{(170)}$ smaller than an elastic modulus $E2_{(10)}$ of the actuator 10 in a flat surface direction. The ratio of the elastic modulus $E_{(170)}$ of the peripheral elastic body 170 to the elastic modulus $E2_{(10)}$ of the actuator 10 in the flat surface direction is equal to or less than 15%. This ratio is preferably equal to or less than 10%.

[Formula 5]

$$E2_{(10)} > E_{(170)} \ldots \quad (5)$$

Additionally, the peripheral elastic body 170 satisfies formula (6) under predetermined conditions. That is, the peripheral elastic body 170 has the loss coefficient $\tan \delta_{(170)}$ that is equal to or less than the loss coefficient $\tan \delta_{(10)}$ of the actuator 10 under predetermined conditions. Under the predetermined conditions, the temperature and the vibration frequency are the same as in the first embodiment.

[Formula 6]

$$\tan \delta_{(10)} \geq \tan \delta_{(20)} \geq \tan \delta_{(30)} \geq \tan \delta_{(170)} \ldots \quad (6)$$

For example, silicone rubber that meets the conditions described above is suitable for the peripheral elastic body 170 as well as the first elastic body 20. For example, urethane rubber is not suitable for the peripheral elastic body 170 because the urethane rubber has relatively good attenuation characteristics. However, urethane rubber may be used for the peripheral elastic body 170 depending on target characteristics.

Figure 4:
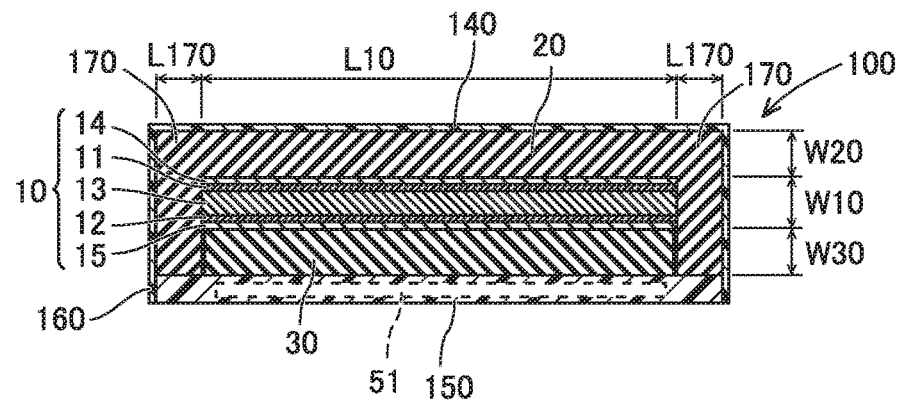
FIG. 4 is a cross-sectional view of a tactile vibration applying device according to a second embodiment.

The first cover 140 is flat and covers a surface of the first elastic body 20 (a top surface of the first elastic body 20 in FIG. 4) and one end surface of the peripheral elastic body 170 (a top surface of the peripheral elastic body 170 in FIG. 4). The second cover 150 is flat and covers a surface of the second elastic body 30 (a bottom surface of the second elastic body 30 in FIG. 4) and the other end surface of the peripheral elastic body 170 (a bottom surface of the peripheral elastic body 170 in FIG. 4). The first cover 140 and the second cover 150 respectively have different sizes from the first cover 40 and the second cover 50 according to the first embodiment, but have substantially the same functions.

The peripheral cover 160 covers the entire outer peripheral surface of the peripheral elastic body 170. An inner peripheral surface of the peripheral cover 160 presses inward the peripheral elastic body 170 in the flat surface direction of the actuator 10. That is, the peripheral cover 160 tightly contacts the outer peripheral surface of the peripheral elastic body 170.

The peripheral cover 160 has an elastic modulus $E_{(160)}$ larger than the elastic modulus $E2_{(10)}$ of the actuator 10 in the flat surface direction and the elastic modulus $E_{(170)}$ of the peripheral elastic body 170. Various materials that meet the conditions described above such as a resin, a metal, and an elastomer can be used for the peripheral cover 160. According to the present embodiment, the peripheral cover 160 is made of the same material as the first cover 140 to be integral with the first cover 140.

The peripheral cover 160 holds the actuator 10 and the peripheral elastic body 170 in a compressed state in the flat surface direction. Here, the elastic modulus $E_{(160)}$ of the peripheral elastic body 170 is smaller than the elastic modulus $E2_{(10)}$ of the actuator 10 in the flat surface direction. The peripheral elastic body 170 is thus compressed more than the actuator 10.

Next, the internal components 10 and 170 of the tactile vibration applying device 100 before and after being held by the peripheral cover 160 are described with reference to FIGS. 4 and 5. The internal components 10 and 170 are held by the peripheral cover 160 as shown in FIG. 4. The width of the actuator 10 in the flat surface direction is denoted by L10. The width of the peripheral elastic body 170 is denoted by L170.

Figure 5:
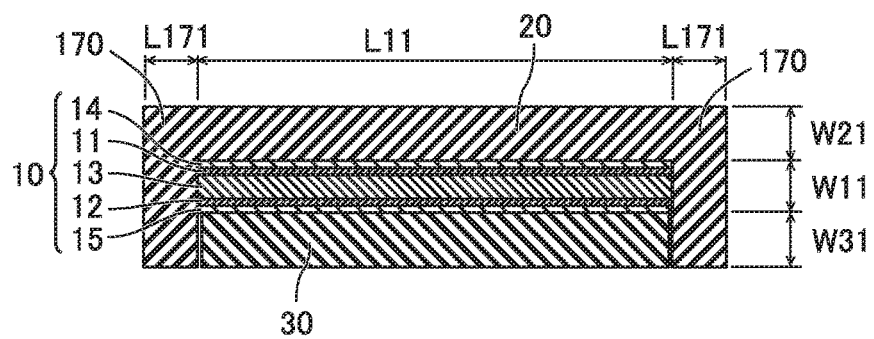
FIG. 5 is a cross-sectional view of internal components of the tactile vibration applying device shown in FIG. 4 before the tactile vibration applying device is mounted on a cover.

Meanwhile, FIG. 5 shows the internal components 10 and 170 before being held by the peripheral cover 160. The width of the actuator 10 in the flat surface direction is denoted by L11 that is substantially equal to L10. The width of the peripheral elastic body 170 is denoted by L171. With this, the internal components 10 and 170 before and after compression thus satisfy the following formulae (7) and (8).

[Formula 7]

$$\frac{L11 - L10}{L11} < \frac{L171 - L170}{L171} \quad (7)$$

[Formula 8]

$$L11 - L10 < L171 - L170 \quad (8)$$

Formula (7) is a relational expression of compressibility, whereas formula (8) is a relational expression of compression amount. The compressibility of the peripheral elastic body 170 is larger than that of the actuator 10 in the flat surface direction. The compression amount of the peripheral elastic body 170 is also larger than that of the actuator 10 in the flat surface direction.

In the tactile vibration applying device 100 according to the second embodiment, the flat surface of the actuator 10 is interposed between the first elastic body 20 and the second elastic body 30. Additionally, the peripheral surface of the actuator 10 is sandwiched between portions of the peripheral elastic body 170. The operation of the tactile vibration applying device 1 according to the first embodiment in the thickness direction is thus equivalent to the operation of the tactile vibration applying device 100 according to the second embodiment in the flat surface direction. That is, not only a tactile vibration transmitted through the first elastic body 20 and the second elastic body 30 but also a tactile vibration transmitted through the peripheral elastic body 170 is generated in the first cover 140 and the peripheral cover 160. Consequently, tactile vibrations caused by the expansion and contraction of the actuator 10 are applied to a user contacting the first cover 140 and the peripheral cover 160 more efficiently.

4. Third Embodiment

Figure 6:
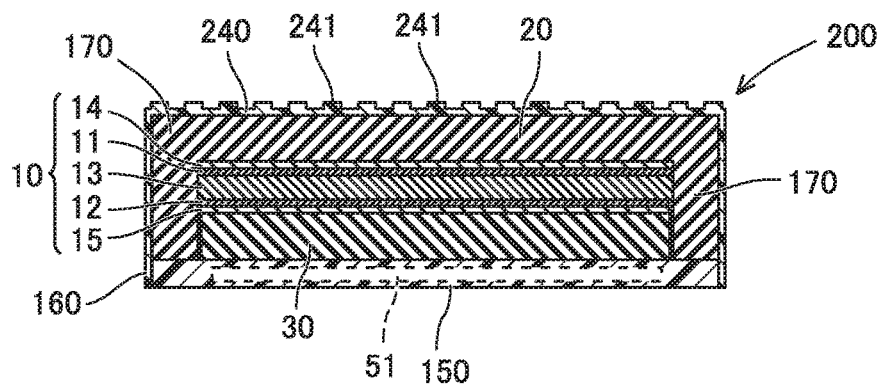
FIG. 6 is a cross-sectional view of a tactile vibration applying device according to a third embodiment.

A tactile vibration applying device 200 according to a third embodiment is described with reference to FIG. 6. In the tactile vibration applying device 200 according to the third embodiment, the same structures as in the tactile vibration applying device 100 according to the second embodiment are denoted by the same reference numerals, and descriptions thereof are omitted.

The tactile vibration applying device 200 includes an actuator 10, a first elastic body 20, a second elastic body 30, a peripheral elastic body 170, a first cover 240, a second cover 150, and a peripheral cover 160. The tactile vibration applying device 200 according to the third embodiment is different from the tactile vibration applying device 100 according to the second embodiment only in the first cover 240. The first cover 240 functions as a tactile vibration applying part for a user and includes a plurality of projections 241 on its surface. The projections 241 may be formed in various shapes including a cylindrical shape, a prismatic shape, a frustoconical shape, and a truncated pyramid shape. The area of a distal end surface of each projection 241 is much less than the area that the user contacts.

As tactile vibrations in the first cover 240 are transmitted via the projections 241 to the user, the surface pressure applied to the user is increased. The user thus feels tactile vibrations more easily. For example, silicone rubber or the like is used for the projections 241 as well as the first elastic body 20. This is because the projections 241 are soft to some degree to reduce stimuli to the user and thus tactile vibrations are appropriately applied to the user. Silicone rubber has a small loss coefficient tan δ as described above and thus when the first cover 240 vibrates, vibrations are hardly attenuated even if the projections 241 are interposed between the first cover 240 and the user. Tactile vibrations are thus reliably applied to the user.

5. Fourth Embodiment

Figure 7A:
FIG. 7A is a perspective view of a substrate of an electrostatic actuator according to a fourth embodiment.

An actuator 310 according to a fourth embodiment is described with reference to FIGS. 7A and 7B. In the actuator 10 according to each of the embodiments described above, the first electrode 11, the second electrode 12, the dielectric layer 13, the first insulating layer 14, and the second insulating layer 15 are flat and laminated to constitute the actuator 10. A long and flat base 310a is prepared as shown in FIG. 7A. The base 310a is constituted in the same manner as the actuator 10 according to the first embodiment and is different from the actuator 10 only in the shape.

Figure 7B:
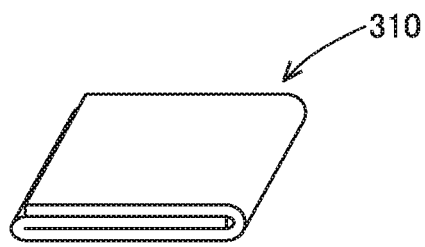
FIG. 7B is a perspective view of the electrostatic actuator according to the fourth embodiment.

The long base 310a shown in FIG. 7A is wound to form an actuator 310 shown in FIG. 7B. The actuator 310 shown in FIG. 7B includes three layers of the actuator 10 shown in FIG. 1, which are laminated together. The actuator 310 enables a multi-layer actuator structure to be easily achieved and large tactile vibrations to be generated.

The actuator 310 is formed by winding the base 310a in the fourth embodiment. The multi-layer actuator structure may be formed by laminating a plurality of the actuators 10 shown in FIG. 1.

6. Other Modifications

The actuator 10 contacts the first cover 40, 140 with the first elastic body 20 being interposed between the first cover 40, 140 and the actuator 10 in the embodiments described above. The actuator 10 contacts the second cover 50, 150 with the second elastic body 30 being interposed between the second cover 50, 150 and the actuator 10 in the embodiments described above. The second elastic body 30 may be eliminated and the actuator 10 may directly contact the second cover 50, 150. That is, a surface of the actuator 10 on a side of the first electrode 11 contacts the first cover 40, 140 with the first elastic body 20 being interposed between the first cover 40, 140 and the actuator 10, but a surface of the actuator 10 on a side of the second electrode 12 directly contacts the second cover 50, 150. In this case, tactile vibrations are applied to the first cover 40, 140 by the first elastic body 20. The operation of the second cover 50, 150 is restricted on the surface of the actuator 10 on the side of the second electrode 12 more than in a case where the second elastic body 30 is interposed between the second cover 50, 150 and the actuator 10. The displacement amount of the actuator 10 is thus reduced easily. While the tactile vibration applying device may eliminate the second elastic body 30, tactile vibrations transmitted to the first cover 40, 140 are reduced.

What is claimed is:

1. A tactile vibration applying device comprising:
   an electrostatic or piezoelectric actuator formed in a flat shape, having a first electrode and a second electrode opposing to each other in a thickness direction, and expanding and contracting at least in the thickness direction;
   a first elastic body having an elastic modulus smaller than an elastic modulus of the electrostatic or piezoelectric actuator in the thickness direction, and disposed in contact with a surface of the electrostatic or piezoelectric actuator on a side of the first electrode; and
   a first cover covering a surface of the first elastic body opposite to a surface of the first elastic body contacting the electrostatic or piezoelectric actuator, pressing the electrostatic or piezoelectric actuator and the first elastic body in the thickness direction of the electrostatic or piezoelectric actuator, and holding the first elastic body in a state that the first elastic body is compressed more than the electrostatic or piezoelectric actuator, wherein the first elastic body covers an entire side of the electrostatic or piezoelectric actuator.

2. The tactile vibration applying device according to claim 1, wherein a ratio of the elastic modulus of the first elastic body to the elastic modulus of the electrostatic or piezoelectric actuator in the thickness direction is equal to or less than 15%.

3. The tactile vibration applying device according to claim 1, wherein a loss coefficient tan δ of the first elastic body is equal to or less than a loss coefficient tan δ of the electrostatic or piezoelectric actuator under predetermined conditions.

4. The tactile vibration applying device according to claim 2, wherein the first elastic body is formed of an elastomer in a flat shape.

5. The tactile vibration applying device according to claim 1, wherein the first cover includes, on a surface of the first cover, a plurality of projections functioning as tactile vibration applying parts for a user.

6. The tactile vibration applying device according to claim 1, wherein the first cover is a touch panel member.

7. The tactile vibration applying device according to claim 1, wherein the electrostatic or piezoelectric actuator is an electrostatic actuator that includes
the first electrode and the second electrode; and
a dielectric body that is interposed between the first electrode and the second electrode and is formed of an elastomer.

8. The tactile vibration applying device according to claim 1, wherein the electrostatic or piezoelectric actuator is a piezoelectric actuator that includes
the first electrode and the second electrode; and
a piezoelectric body that is interposed between the first electrode and the second electrode.

9. A tactile vibration applying device comprising:
an electrostatic or piezoelectric actuator formed in a flat shape, having a first electrode and a second electrode opposing to each other in a thickness direction, and expanding and contracting at least in the thickness direction;
a first elastic body having an elastic modulus smaller than an elastic modulus of the electrostatic or piezoelectric actuator in the thickness direction, and disposed in contact with a surface of the electrostatic or piezoelectric actuator on a side of the first electrode;
a first cover covering a surface of the first elastic body opposite to a surface of the first elastic body contacting the electrostatic or piezoelectric actuator, pressing the electrostatic or piezoelectric actuator and the first elastic body in the thickness direction of the electrostatic or piezoelectric actuator, and holding the first elastic body in a state that the first elastic body is compressed more than the electrostatic or piezoelectric actuator;
a second elastic body having an elastic modulus smaller than the elastic modulus of the electrostatic or piezoelectric actuator in the thickness direction, and disposed to contact a surface of the electrostatic or piezoelectric actuator on a side of the second electrode; and
a second cover covering a surface of the second elastic body opposite to a surface of the second elastic body contacting the electrostatic or piezoelectric actuator, pressing the electrostatic or piezoelectric actuator, the first elastic body and the second elastic body together with the first cover in the thickness direction of the electrostatic or piezoelectric actuator, and holding the first elastic body and the second elastic body in a state that the first elastic body and the second elastic body are compressed more than the electrostatic or piezoelectric actuator.

10. The tactile vibration applying device according to claim 9, wherein the second cover is electrically connected to the first electrode and the second electrode and functions as a circuit board unit for controlling a voltage applied to the first electrode and the second electrode.

11. A tactile vibration applying device comprising:
an electrostatic or piezoelectric actuator formed in a flat shape, having a first electrode and a second electrode opposing to each other in a thickness direction, and expanding and contracting at least in the thickness direction;
a first elastic body having an elastic modulus smaller than an elastic modulus of the electrostatic or piezoelectric actuator in the thickness direction, and disposed in contact with a surface of the electrostatic or piezoelectric actuator on a side of the first electrode; and
a first cover covering a surface of the first elastic body opposite to a surface of the first elastic body contacting the electrostatic or piezoelectric actuator, pressing the electrostatic or piezoelectric actuator and the first elastic body in the thickness direction of the electrostatic or piezoelectric actuator, and holding the first elastic body in a state that the first elastic body is compressed more than the electrostatic or piezoelectric actuator,
wherein the electrostatic or piezoelectric actuator expands and contracts in a flat surface direction, and
the tactile vibration applying device, further comprising:
a peripheral elastic body having an elastic modulus smaller than an elastic modulus of the electrostatic or piezoelectric actuator in the flat surface direction, and disposed to contact a peripheral surface of the electrostatic or piezoelectric actuator; and
a peripheral cover covering a surface of the peripheral elastic body opposite to a surface of the peripheral elastic body contacting the electrostatic or piezoelectric actuator, pressing the electrostatic or piezoelectric actuator and the peripheral elastic body in the flat surface direction of the electrostatic or piezoelectric actuator, and holding the peripheral elastic body in a state that the peripheral elastic body is compressed more than the electrostatic or piezoelectric actuator.

* * * * *